United States Patent
Boshart et al.

(10) Patent No.: US 7,340,697 B2
(45) Date of Patent: Mar. 4, 2008

(54) INTEGRATED COMPUTER-AIDED CIRCUIT DESIGN KIT FACILITATING VERIFICATION OF DESIGNS ACROSS DIFFERENT PROCESS TECHNOLOGIES

(75) Inventors: Shawn Boshart, Grantville, PA (US); Jee-Hoon Krska, New Providence, NJ (US); John Gavin Lentz, Orefield, PA (US); Joshua Williams, Perkasie, PA (US)

(73) Assignee: Agere Systems Inc., Allentown, PA (US)

( * ) Notice: Subject to any disclaimer, the term of this patent is extended or adjusted under 35 U.S.C. 154(b) by 399 days.

(21) Appl. No.: 11/019,885

(22) Filed: Dec. 22, 2004

(65) Prior Publication Data

US 2006/0136860 A1 Jun. 22, 2006

(51) Int. Cl.
G06F 17/50 (2006.01)
G06F 19/00 (2006.01)

(52) U.S. Cl. ............ 716/3; 716/4; 716/5; 716/18; 716/19; 703/14; 700/19

(58) Field of Classification Search ......... 716/1–5, 716/18, 19; 703/14; 702/19
See application file for complete search history.

(56) References Cited

U.S. PATENT DOCUMENTS

| 5,210,701 | A * | 5/1993 | Hana et al. ............... 716/1 |
| 6,128,768 | A * | 10/2000 | Ho ............................ 716/5 |
| 6,219,821 | B1 * | 4/2001 | Hagerman et al. ........ 716/5 |
| 6,477,683 | B1 * | 11/2002 | Killian et al. ............. 716/1 |
| 6,529,913 | B1 * | 3/2003 | Doig et al. ............ 707/101 |
| 6,530,065 | B1 * | 3/2003 | McDonald et al. ........ 716/4 |
| 6,553,542 | B2 * | 4/2003 | Ramaswamy et al. ..... 716/2 |
| 6,578,179 | B2 | 6/2003 | Shirotori et al. |
| 6,587,997 | B1 * | 7/2003 | Chen et al. ............... 716/4 |
| 6,701,289 | B1 * | 3/2004 | Garnett et al. .......... 703/14 |
| 6,704,908 | B1 * | 3/2004 | Horan et al. .............. 716/1 |
| 6,851,094 | B1 * | 2/2005 | Robertson et al. ........ 716/1 |
| 6,950,995 | B2 * | 9/2005 | Hegde et al. .............. 716/1 |
| 6,968,518 | B2 * | 11/2005 | Hegde et al. .............. 716/3 |
| 6,990,650 | B2 * | 1/2006 | Teig et al. ............... 716/12 |
| 7,020,854 | B2 * | 3/2006 | Killian et al. ............. 716/1 |
| 7,028,272 | B2 * | 4/2006 | Mandal et al. ............ 716/2 |
| 7,039,881 | B2 * | 5/2006 | Regan ..................... 716/3 |
| 7,039,882 | B2 * | 5/2006 | Rana et al. ............... 716/3 |
| 7,051,297 | B2 * | 5/2006 | Hamlin .................... 716/3 |
| 7,062,729 | B2 * | 6/2006 | Gray et al. ............... 716/3 |
| 7,069,533 | B2 * | 6/2006 | Kochpatcharin et al. .. 716/19 |
| 7,076,760 | B2 * | 7/2006 | Teig et al. ............... 716/12 |
| 7,092,865 | B1 * | 8/2006 | Burnley et al. .......... 703/14 |
| 7,146,586 | B2 * | 12/2006 | Bohl et al. ................ 716/4 |
| 7,171,346 | B1 * | 1/2007 | Recker et al. ........... 703/14 |
| 2002/0032493 | A1 * | 3/2002 | Kadowaki et al. ....... 700/97 |
| 2004/0143799 | A1 | 7/2004 | Hedge et al. |
| 2005/0071792 | A1 * | 3/2005 | Ferguson et al. .......... 716/4 |

(Continued)

*Primary Examiner*—Stacy A Whitmore
*Assistant Examiner*—Helen Rossoshek

(57) ABSTRACT

Methods and apparatus are described that allow an integrated circuit designer to design integrated circuits for more than one process technology using a single master design environment. The master design environment is achieved, in part, by the creation of a centralized master database that comprises device models belonging to more than one process technology. Creation of the master database occurs by parsing a plurality of external databases comprising device models belonging to more than one process technology. The use of a single master design environment simplifies the task of designing an integrated circuit, and also reduces the chance of error.

14 Claims, 2 Drawing Sheets

U.S. PATENT DOCUMENTS

| | | | |
|---|---|---|---|
| 2005/0216877 A1* | 9/2005 | Pack et al. | 716/19 |
| 2005/0273736 A1* | 12/2005 | Youngman et al. | 716/4 |
| 2006/0101356 A1* | 5/2006 | Allen et al. | 716/3 |
| 2006/0212229 A1* | 9/2006 | Balaban et al. | 702/19 |
| 2006/0218512 A1* | 9/2006 | Arslan et al. | 716/4 |
| 2006/0271892 A1* | 11/2006 | Bohl et al. | 716/5 |

* cited by examiner

INTEGRATED COMPUTER-AIDED CIRCUIT DESIGN KIT FACILITATING VERIFICATION OF DESIGNS ACROSS DIFFERENT PROCESS TECHNOLOGIES

FIELD OF THE INVENTION

This invention relates to the design of integrated circuits and, more specifically, to methods and apparatus for the design of integrated circuits.

BACKGROUND OF THE INVENTION

Circuit designers frequently wish to have a given integrated circuit design be produced at more than one integrated circuit fabrication site ("foundry"). Unfortunately, due to differences in tooling and process specializations, process technologies used at different foundries are rarely identical. Typically, each process technology has at least its own minimum design rules and electrical parameters.

In order to assist the designer in creating designs capable of being produced at a specific foundry, most foundries allow an integrated circuit designer to access a foundry-specific "process design kit," or PDK. The PDK, coupled with various other generic design software, usually constitutes the basic environment necessary to design an integrated circuit. A fully integrated PDK includes all the necessary components to design, simulate, layout and verify a chip design. Once the design is in acceptable form, a file, typically in a binary format called "Graphic Design System II" or "GDSII" is submitted to the foundry for reticle-build processing and eventual integrated circuit production.

Unfortunately, there is little standardization among process design kits from different foundries. Each provider typically has its own way of developing, delivering and describing the kits. This lack of standardization requires that the designer "migrate" or "port" a design to a given PDK environment in order to create a design capable of being produced at the corresponding foundry. Since each PDK is different, an unfamiliar PDK presents the user with a relatively steep learning curve. Moreover, the migration process is time consuming, error prone and requires the creation of multiple copies of the original design database. Once a design is migrated to more than one process technology, multiple copies of the design will need to be maintained. Future modifications to the design then need to be made independently in each separate design environment, often leading to mistakes and inconsistencies. These added tasks and their associated risks create a significant challenge to integrated circuit designers striving to meet time-to-market opportunities.

Because of these disadvantages, methods and apparatus that allow an integrated circuit designer to design integrated circuits for more than one process technology using a single design environment would be extremely advantageous.

SUMMARY OF THE INVENTION

The present invention addresses the above-identified need by providing novel methods and apparatus that allow an integrated circuit designer to design integrated circuits for more than one process technology using a single master design environment. The master design environment is achieved, in part, by the creation of a centralized master database that comprises device models belonging to more than one process technology.

In accordance with an aspect of the invention, a method for designing an integrated circuit comprises the steps, performed by a processing unit including a processor and a memory, of receiving a source design comprising information identifying a plurality of devices and receiving information identifying a target process technology. In addition, the method includes determining whether each of the plurality of devices in the source design has a corresponding device model belonging to the target process technology in a master database. The master database is created by parsing a plurality of external databases comprising a plurality of device models belonging to more than one process technology and storing the plurality of device models as a function of the more than one process technology. The method further comprises verifying the operation of the source design in the target process technology using the corresponding device models belonging to the target process technology in the master database.

Advantageously, the use of a single design environment eliminates the need to migrate or port a given integrated circuit design to a new PDK in order to create a design capable of being produced at the corresponding foundry. Furthermore, the requirement that a designer learn more than one design environment is also eliminated. These benefits simplify the task of designing an integrated circuit, and also reduce the chance of error.

DETAILED DESCRIPTION OF THE INVENTION

This invention will be illustrated in conjunction with an exemplary method for designing integrated circuits and an associated data precessing unit. It should be understood, however, that the invention is not limited to the illustrative embodiments presented herein. Modifications and expansions of the illustrative embodiments will be readily apparent to those skilled in the art.

Figure 1:
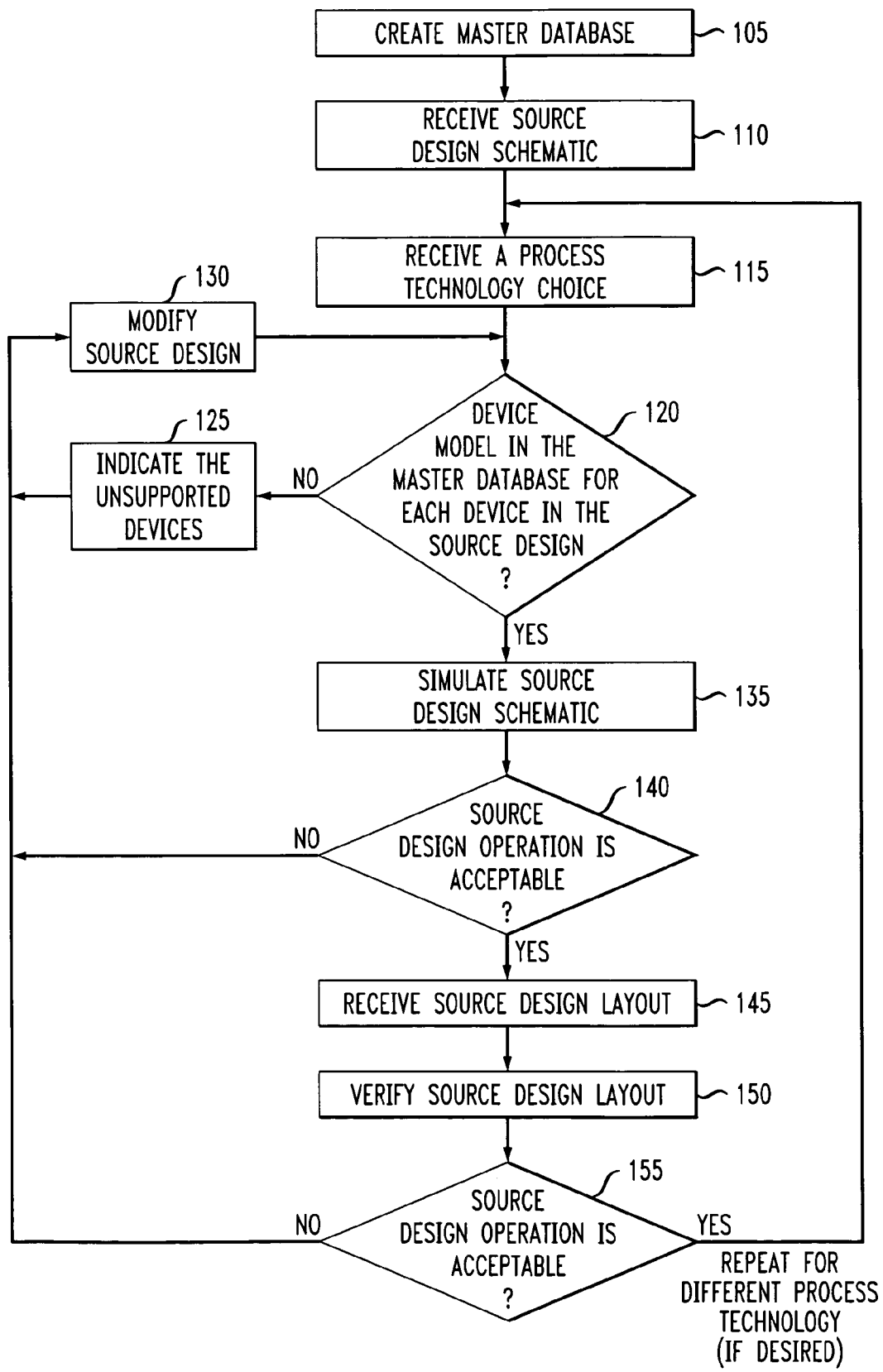
FIG. 1 shows a flow diagram of an illustrative embodiment of a method for designing an integrated circuit in accordance with the invention.
Figure 2:
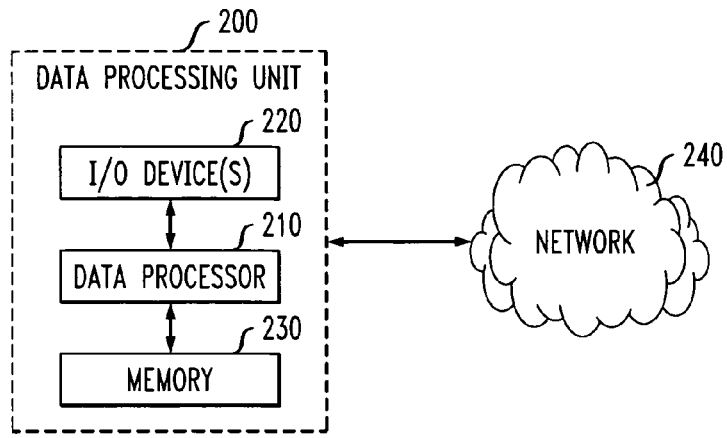
FIG. 2 shows a block diagram of a data processing unit and network configuration for use in implementing the FIG. 1 method embodiment.

FIG. 1 shows a flow diagram of an illustrative embodiment of a method for designing an integrated circuit in accordance with the invention. The method includes steps 105 through 155, as will be described below. Because integrated circuit design is computationally demanding, the illustrative design method is implemented in a data processing unit. FIG. 2 is a block diagram showing an exemplary data processing unit for use in implementing the method embodiment described in FIG. 1. The data processing unit 200 contains three portions: a data processor portion 210, an input/output (I/O) device portion 220, and a memory portion 230. Data processing units with this configuration are commonly used by integrated circuit designers and are commercially available. An appropriate data processing unit 200, for instance, would comprise a computer workstation capable of running computer-aided design (CAD) programs, such as a workstation produced by Silicon Graphics, Inc. (Mountain View, Calif.). Other types of computers may also be used. The designer may interact with the workstation or other computer through one or more display monitors, keyboards and computer pointing devices. The interaction preferably occurs via a graphical user interface. As further shown in FIG. 2, the exemplary data processing unit 200 is connected to a network 240. This network connection allows the data processing unit 200 to access files and data external to itself. Of course, this particular configuration is presented by way of example only, and numerous alternative data processing units can be used in implementing the invention.

Referring again to FIG. 1, step 105 comprises creating a master database. The master database is instrumental in allowing the designer to design an integrated circuit for more than one process technology using a single integrated design environment. In accordance with an aspect of the invention, the master database comprises a plurality of device models belonging to more than one process technology. Each of the device models is stored in the master database as a function of their associated process technology.

Figure 3:
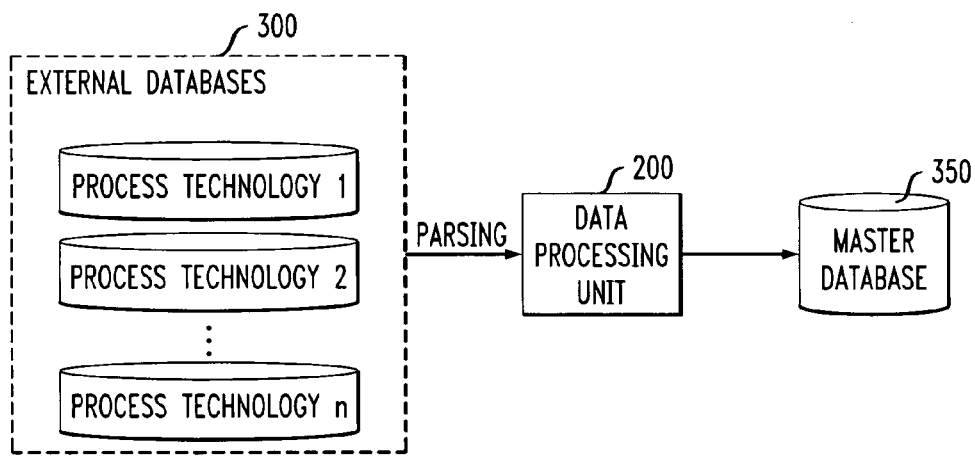
FIG. 3 shows a block diagram of an exemplary configuration for creating a master database for use in the FIG. 1 method embodiment.

In accordance with another aspect of the invention, the master database is created by parsing a plurality of external databases that contain device models belonging to more than one process technology. FIG. 3 shows a block diagram of an exemplary configuration for creating a master database. In this exemplary configuration, a plurality of external databases 300 are made available as part of multiple foundries' PDKs. Data processing unit 200 accesses the external databases 300 via the network 240. The data processing unit 200 parses the plurality of external databases 300, searching for and extracting the device models. Parsing is preferably performed using commonly utilized techniques such as a top-down parsing scheme. Parsing methodologies will be familiar to one of ordinary skill in the computer science art and are, furthermore, described in numerous publications, for example, Alfred V. Aho, et. al., *Compilers, Principles, Techniques and Tools*, Addison Wessley, 1986, which is incorporated by reference.

The device models obtained by the parsing step preferably contain device parameters which describe common integrated circuit components such as, but not limited to, resistors, capacitors, inductors, voltage and current sources, transmission lines, switches, and semiconductor devices (e.g., diodes and metal-oxide-semiconductor field effect transistors (MOSFETS)). The device models allow electrical operating characteristics of a device to be determined from information supplied from the integrated circuit source design and/or designer such as device size, input voltages and device operating temperatures. For example, a source design may describe a resistor of a given length, width and operating temperature. The associated device model for this type of resistor would allow the electrical resistance of the resistor to be determined if the resistor were formed using a specific process technology at a specific foundry.

The device models in the master database will preferably be in a format compatible with SPICE (Simulation Program with Integrated Circuits Emphasis), a freely available circuit simulation programs developed at the University of California, Berkeley. SPICE is commonly used by foundries to describe devices and by integrated circuit designers to verify integrated circuit designs. SPICE, or program similar to it, will be familiar to one of ordinary skill in the art. Moreover, many publications describe the program in detail, such as *The SPICE3f User's Manual*, University of California, Berkeley, which may be obtained on the public internet and which is incorporated by reference. As an illustration, a SPICE-compatible device model for a resistor will typically contain device parameters such as temperature coefficients, sheet resistance and length/width parameters that describe device narrowing due to process biases. A device model for a more complex device, such as an n-type MOSFET (NMOS) will, on the other hand, typically contain many more device parameters (often greater than twenty). These parameters may describe the threshold voltage, source and drain resistances, diffusion lengths, and many other characteristics of the device. A device model will also contain a device model name to identify that model.

Again referring to FIG. 1, the second step 110 in the illustrative embodiment of a method for designing an integrated circuit comprises receiving a source design in a schematic representational form (hereinafter referred to as a "source design schematic") from the user. A schematic representation of an integrated circuit design is commonly used by integrated circuit designers and will be familiar to one skilled in the art. In a schematic representation, interconnected circuit symbols provide a graphical representation of the circuit components. Alphanumeric fields may be associated with the circuit symbols and allow customization of component properties such as device width and length. The step of receiving a source design schematic may comprise the designer using a schematic editing tool to enter the design into the data processing unit 200. Schematic editors provide simple, intuitive means to draw, to place and to connect individual circuit components that make up the design. The CAD program Cadence Vituoso by Cadence Design Systems (San Jose, Calif.), for example, is commercially available and provides these kinds of schematic editing functions. Of course, if the source design schematic already exists as a file in memory 230, step 110 may comprise, for example, the designer entering a file path pointing to the file containing the appropriate schematic.

Once the source design schematic is received, step 115 is performed wherein the user chooses a target process technology from among those process technologies with device models stored on the master database 350. The target process technology is the process technology for which the designer wishes to verify the source design. Step 115 is preferably performed by the user choosing from a list of available process technologies displayed to the user on the user interface of the data processing unit 200.

Subsequently, the data processing unit 200 determines whether each of the plurality of devices in the source design schematic has a corresponding device model belonging to the target process technology contained in the master database. This step is shown as step 120 in FIG. 1. Typically, the devices in the source design are represented by one or more source device names, or device character strings. Moreover, as described earlier, the device models also comprise device model character strings, e.g., device model names. In accordance with an aspect of the invention, the step of determining whether each of the devices in the source design has a corresponding device model belonging to the target process technology in the master database comprises comparing the source device character strings with device model character strings. Based on these comparisons, the device models in the master database are matched against their respective devices in the source design.

In accordance with yet another aspect of the invention, the data processing unit 200 will indicate to the designer the existence of an "unsupported" device if a device in the source design is determined not to have a corresponding device model in the master database 350. This step is shown as step 125 in FIG. 1. The indication could, for instance, be a red, flashing device symbol on the schematic representation of the source design. This step is critical to avoid having a design targeted to a specific process technology incorporate devices that cannot be produced by that target process technology. Once the indication is received by the designer, the designer is provided an opportunity, in step 130, to modify the source design in order to replace the unsupported device with one or more devices that are supported. Once modified, the designer may then again proceed to step 120.

After the devices in the source design are determined to have associated device models in the master database 350, the source design schematic is in position for simulation in the target process technology. This simulation step is represented by step 135 in the illustrative method embodiment shown in FIG. 1. The simulation step involves simulating the source design in the target process using the corresponding device models belonging to the target process technology in the master database 350. As mentioned above, the simulation is preferably performed by a SPICE-based circuit simulator. Different types of analysis are commonly available, for instance, DC analysis, AC small-signal analysis and noise analysis. The simulator typically operates at the component level, solving a series of equations that define the component voltages, currents or other parameters. The output of the simulator checks the integrity of the integrated circuit design as well as predicts its behavior.

Additionally or alternatively, the simulation step 135 may include a timing verification. Timing verification enables the propagation delays through each branch of the circuit to be determined. This may be particularly useful where the integrated circuit design has to meet stringent time specifications and, therefore, propagation delays must be reduced. Moreover, the simulation step may include fault simulations. Fault simulations check whether possible circuit faults arising out of manufacturing defects can be detected at the outputs by applying suitable sets of test patterns at the inputs. A fault "dictionary" may be produced thereby, allowing the designer to refine the test patterns until the maximum number of faults is covered. This dictionary becomes critical when actual integrated circuits are tested.

Step 140 in FIG. 1 represents an evaluation of whether the simulation of the source design schematic meets the design specifications. If the results of the simulations of step 135 indicate that the source design schematic requires modifications, the designer is again given the opportunity to modify the source design (step 130). After any modifications, the process goes to step 120 wherein it is again determined whether each of the devices in the source design has a corresponding device model for the target process technology in the master database 350. Alternatively, if the simulations indicate that the source design meets the design goals, the design process continues to step 145.

The next series of steps in the illustrative method embodiment of FIG. 1 involves verifying a layout representation of the source design (hereinafter referred to as a "source design layout"). The source design layout represents the same source design as the source design schematic. However, in a layout representation, the integrated circuit design is topographically represented as it would physically appear when formed into a semiconductor device as opposed to being represented by device symbols. When complete and verified to operate as desired, this layout representation may be converted into lithographic masks for physically printing the design onto the semiconductor.

A source design schematic may be produced in a number of different ways which will be familiar to one skilled in the art. The designer, may, for instance, use a layout-editing program, such as Cadence Virtuoso, to create the layout. Alternatively, some computer-based programs may be capable of automatically converting a source design schematic into a source design layout that is "correct by construction." Usually, however, a layout produced in this automated way is not optimized for area efficiency and circuit performance. Therefore, the designer will typically use a layout-editing program to modify the resultant layout to achieve these desirable characteristics.

Figure 4:
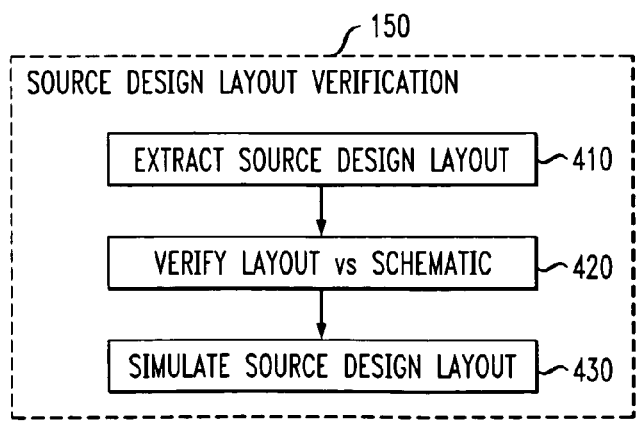
FIG. 4 shows a flow diagram of an exemplary method for verifying a layout representation of the source design for use in the FIG. 1 method embodiment.

Step 145 in FIG. 1 comprises receiving the source design layout from the user. Subsequently, in step 150 of FIG. 1, the source design layout is verified. FIG. 4 shows a flow diagram of an illustrative method embodiment of step 150 of FIG. 1. The verification of a source design layout will be familiar to one skilled in the art. Moreover, the various steps in the illustrative method embodiment shown in FIG. 4 can be accomplished using commercially available programs such as Cadence Virtuoso. Step 410 of FIG. 4 comprises source design layout extraction. Layout circuit extraction is performed in order to create a detailed net-list representation of the source design layout (hereinafter referred to as the "extracted net-list"). A net-list is simply a text-based representation of the integrated circuit design which identifies the individual device components and their interconnections as well as the parasitic resistances and capacitances that may be present between devices. The extracted net-list provides a very accurate estimation of the actual device dimensions and device parasitics that ultimately determine the circuit performance.

In step 420 of FIG. 4, the extracted net-list is compared to the source design schematic in a step referred to as a layout-versus-schematic (LVS) check. This LVS check will determine whether the schematic and layout representations functionally describe identical circuits. Moreover, the LVS step provides an additional level of confidence for the integrity of the design, and ensures that the source design layout is a correct realization of the intended circuit. It should be noted that the LVS check only guarantees topological match. A successful LVS will not guarantee that the extracted layout will actually satisfy the performance specifications. This type of verification is relegated to the next step.

Step 430 in FIG. 4 analyzes the performance of the source design layout by simulating the extracted net-list. The simulation is preferably performed in the same way that the source design schematic was simulated in step 135. Like before, this simulation is performed utilizing device models in the master database 350. The detailed simulation performed using the extracted net-list provides a clear assessment of the circuit speed, the influence of circuit parasitics (such as parasitic capacitances and resistances), and any issues that may occur due to signal delay mismatches.

As further shown by step 155 in FIG. 1, the results of source design layout verification are analyzed after the verification process is completed. If the results are not satisfactory, the process returns to step 130 where the designer may modify the source design. The designer, for instance, may choose to modify some of the transistor dimensions in order to achieve the desired circuit performance. Once modified, the designer may then again proceed to step 120.

If the results of step 155 of FIG. 1 indicate that the source design layout is acceptable, the designer has succeeded in designing a form of the source design capable of production in the target process technology and in compliance with the design specifications. Advantageously, the designer now has the capability to modify the source design for production by a different process technology using the identical design environment. This occurs in the illustrative method embodiment of FIG. 1 by returning to step 115 and having the designer select a new target process technology from those available in the master database 350. The process then proceeds from that step as indicated in the figure and as described above. Gone, therefore, is the need to migrate or port a given source design to a new PDK environment in order to create a design capable of being produced at the corresponding foundry. Also gone is the requirement to learn a new design environment. The integrated circuit designer, thereby, benefits.

It should be noted that a foundry may periodically change the device models associated with a given process technology. When this occurs, it will be necessary to recreate the master database by again parsing the appropriate external databases. The recreation of the master database may be performed on a regular basis or, alternatively, may be performed only when notice of changes to the device models in an external database is received, if such notice is available.

It should also be noted that integrated circuits formed from integrated circuit designs that were created in accordance with this invention are considered part of this invention. One skilled in the art will know how to form an integrated circuit from an integrated circuit design. Typically, a plurality of identical integrated circuits are formed in a repeated manner on a surface of a silicon wafer using various semiconductor processing equipment and techniques. The integrated circuits are typically cut from the wafer, packaged and tested before they are utilized or sold.

It should be emphasized that the above-described method embodiments of the invention are intended to be illustrative only. Numerous other embodiments of the invention will fall within the scope of the following claims. For instance, another embodiment may comprise a computer-readable medium having stored therein instructions for causing a data processing unit to execute the steps of designing an integrated circuit in accordance with aspects of the invention. These numerous other alternative embodiments will be apparent to one skilled in the art.

What is claimed is:

1. A method for designing an integrated circuit comprising the steps, performed by a data processing unit including a processor and a memory, of:
   receiving a source design comprising information identifying a plurality of devices;
   receiving information identifying a target process technology;
   determining whether each of the plurality of devices in the source design has a corresponding device model belonging to the target process technology in a master database, the master database being created by parsing a plurality of external databases comprising a plurality of device models belonging to more than one process technology and storing the plurality of device models as a function of the more than one process technology; and
   verifying the operation of the source design in the target process technology using the corresponding device models belonging to the target process technology in the master database;
   wherein the source design is modified when the verifying step indicates the source design is inoperative in the target process technology;
   wherein the plurality of device models in the master database is represented by one or more device model character strings, the plurality of devices in the source design is represented by one or more source device character strings, and the step of determining whether each of the plurality of devices in the source design has a corresponding device model belonging to the target process technology in the master database comprises comparing at least one of the one or more device model character strings with at least one of the one or more source device character strings.

2. The method of claim 1 wherein the plurality of device models belonging to more than one process technology in the plurality of external databases describes devices produced by more than one foundry.

3. The method of claim 1 wherein the step of verifying the operation of the source design in the target process technology comprises simulating the operation of the source design.

4. The method of claim 1 wherein the step of verifying the operation of the source design in the target process technology comprises simulating the operation of the source design using a SPICE-based circuit simulator.

5. The method of claim 1 wherein the step of verifying the operation of the source design in the target process technology comprises verifying the timing of the source design.

6. The method of claim 1 wherein the step of verifying the operation source design in the target process technology comprises fault simulation of the source design.

7. The method of claim 1 wherein the step of receiving the source design comprises a user entering information characterizing a schematic representation of the source design into the data processing unit.

8. The method of claim 1 wherein the step of receiving the source design comprises a user entering information characterizing a layout representation of the source design into the data processing unit.

9. The method of claim 1 wherein:
   the step of receiving the source design comprises a user entering information characterizing a layout representation and a schematic representation of the source design into the data processing unit; and
   the step of verifying the operation of the source design comprises comparing the functionality of an electrical circuit represented by the layout representation with an electrical circuit represented by the schematic representation.

10. The method of claim 1 further comprising the step of indicating each of the plurality of devices in the source design determined not to have the corresponding device model belonging to the target process technology in the master database.

11. The method of claim 1 further comprising:
    modifying the source design;
    determining whether each of the plurality of devices in the modified source design has a corresponding device model belonging to the target process technology in the master database; and
    verifying the operation of the modified source design in the target process technology using the corresponding device models belonging to the target process technology in the master database.

12. The method of claim 1 further comprising recreating the master database after changes are made to the external databases.

13. A computer-readable medium having stored therein instructions for causing a data processing unit including a processor and a memory to execute the steps of:
- receiving a source design comprising information identifying a plurality of devices;
- receiving information identifying a target process technology;
- determining whether each of the plurality of devices in the source design has a corresponding device model belonging to the target process technology in a master database, the master database being created by parsing a plurality of external databases comprising a plurality of device models belonging to more than one process technology and storing the plurality of device models as a function of the more than one process technology; and
- verifying the operation of the source design in the target process technology using the corresponding device models belonging to the target process technology in the master database;
- wherein the source design is modified when the verifying step indicates the source design is inoperative in the target process technology;
- wherein the plurality of device models in the master database is represented by one or more device model character strings, the plurality of devices in the source design is represented by one or more source device character strings, and the step of determining whether each of the plurality of devices in the source design has a corresponding device model belonging to the target process technology in the master database comprises comparing at least one of the one or more device model character strings with at least one of the one or more source device character strings.

14. An apparatus for designing an integrated circuit comprising a data processing unit having a processor and a memory and being operative to:
- receive a source design comprising information identifying a plurality of devices;
- receive information identifying a target process technology;
- determine whether each of the plurality of devices in the source design has a corresponding device model belonging to the target process technology in a master database, the master database being created by parsing a plurality of external databases comprising a plurality of device models belonging to more than one process technology and storing the plurality of device models as a function of the more than one process technology; and
- verify the operation of the source design in the target process technology using the corresponding device models belonging to the target process technology in the master database;
- wherein the plurality of device models in the master database is represented by one or more device model character strings, the plurality of devices in the source design is represented by one or more source device character strings, and determining whether each of the plurality of devices in the source design has a corresponding device model belonging to the target process technology in the master database comprises comparing at least one of the one or more device model character strings with at least one of the one or more source device character strings.

* * * * *